United States Patent
Zheng et al.

(10) Patent No.: US 6,734,443 B2
(45) Date of Patent: May 11, 2004

(54) APPARATUS AND METHOD FOR REMOVING PHOTOMASK CONTAMINATION AND CONTROLLING ELECTROSTATIC DISCHARGE

(75) Inventors: Jun Fei Zheng, Cambridge, MA (US); Giang Dao, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 392 days.

(21) Appl. No.: 09/850,766

(22) Filed: May 8, 2001

(65) Prior Publication Data

US 2002/0179852 A1 Dec. 5, 2002

(51) Int. Cl.⁷ .................................................. B08B 7/00
(52) U.S. Cl. .............................. 250/492.1; 250/492.2; 134/1.1; 438/795; 438/708; 438/709
(58) Field of Search ........................... 250/492.1, 492.2, 250/504 R; 134/1, 1.1, 26, 42; 438/795, 708, 709

(56) References Cited

U.S. PATENT DOCUMENTS

| | | | |
|---|---|---|---|
| 5,275,667 A | * 1/1994 | Ganesan et al. | ................ 134/1 |
| 5,559,584 A | * 9/1996 | Miyaji et al. | .................. 355/73 |
| 5,580,421 A | * 12/1996 | Hiatt et al. | ............... 150/643.1 |
| 5,737,072 A | 4/1998 | Emery et al. | |
| 5,741,576 A | 4/1998 | Kuo | |
| 5,999,397 A | 12/1999 | Chen | |
| 6,063,208 A | 5/2000 | Williams | |
| 6,098,637 A | * 8/2000 | Parke | ......................... 134/1.1 |
| 6,153,044 A | 11/2000 | Klebanoff et al. | |
| 6,165,650 A | 12/2000 | Williams | |
| 6,169,652 B1 | 1/2001 | Klebanoff | |
| 6,196,391 B1 | 3/2001 | Li | |
| 6,208,747 B1 | 3/2001 | Nguyen et al. | |
| 6,209,553 B1 | 4/2001 | Nagamura et al. | |
| 6,219,171 B1 | 4/2001 | Liao et al. | |
| 6,222,936 B1 | 4/2001 | Phan et al. | |
| 6,277,767 B1 | * 8/2001 | Shiramizu et al. | .......... 438/795 |
| 6,551,407 B2 | * 4/2003 | Drzal et al. | ..................... 134/1 |

OTHER PUBLICATIONS

"Neutralization of static electricity by soft X–rays and vacuum UV radiation" Journal of Electrostatic 33 (1994) 15–42.

* cited by examiner

*Primary Examiner*—Kiet T. Nguyen
(74) *Attorney, Agent, or Firm*—Blakely, Sokoloff, Taylor & Zafman LLP

(57) ABSTRACT

A method and apparatus to remove contamination and control electrostatic discharge in-situ in a semiconductor device manufacture process. In an embodiment, the method includes providing a reticle having first and second planar surfaces into a chamber. A circuit pattern of opaque material may be disposed on the first planar surface of the reticle. The method further includes irradiating the reticle using an ultraviolet light radiation beam to remove contamination disposed on the first and second planar surfaces of the reticle and to neutralize static electricity accumulated by the reticle.

29 Claims, 4 Drawing Sheets

APPARATUS AND METHOD FOR REMOVING PHOTOMASK CONTAMINATION AND CONTROLLING ELECTROSTATIC DISCHARGE

BACKGROUND OF THE INVENTION

1. Field of the Invention

The present invention relates to integrated circuit (IC) manufacture and more particularly to an apparatus and method to remove organic matter contamination and particulate contamination from a photomask or reticle and a pellicle and to control electrostatic discharge (ESD) through in-situ application of ultraviolet light radiation during semiconductor manufacture.

2. Description of Related Art

Integrated circuits are generally made by photolithographic processes that use photomasks or reticles and an associated light source to project a circuit image on the surface of a silicon wafer or substrate. A photomask or reticle is generally a transparent ceramic substrate that is coated with a metallic layer forming a pattern for an electronic circuit. A pellicle is typically used to seal the photomask or reticle, isolating and protecting the reticle surface from particulate contamination and eliminating dust or other particles from the focal plane of the reticle pattern during the manufacture of integrated circuits.

In order to produce functioning integrated circuits at a high yield rate, the reticle and pellicle need to be free of defects that typically occur during integrated circuit (IC) manufacture, and specifically during processing and or handling of the reticle and pellicle. One such defect is organic/molecular contamination of the reticle surface. Surface molecular contamination, such as chemical stains or residues, on the surface of the reticle reduces and degrades the transmittance property and/or characteristic of the reticle, ultimately impacting the quality of the semiconductor device manufactured.

Another concern or defect affecting the quality of integrated circuits during the photolithography process is particulate contamination of the reticle. Particulate contamination may include any small particles, such as dust particles, that may be caught between the reticle mask and pellicle when affixing the two together. Particulate contamination may cause the photolithographic pattern transmitted on the wafer to change, distort, alter, etc. from its intended design, ultimately impacting the quality of the semiconductor device manufactured.

Another concern or defect affecting the quality of integrated circuits during the photolithography process is electrostatic discharge-induced defects or effects. In the semiconductor device manufacture, static electricity or electrostatic discharge (ESD) frequently develops on reticle surfaces or other surfaces made of insulating materials when they are touched or rubbed by other insulating materials. The electricity is produced based on a triboelectricity theory. The discharge of the static electricity can cause damages to semiconductor device as well as process tools. Furthermore, when electrostatic discharge (ESD) occurs after the assembly of pellicle to reticle, particulate contamination may be produced and affixed to the pellicle/reticle. This causes the photolithographic pattern transmitted on the wafer to distort from its intended design, ultimately impacting the quality of the semiconductor manufactured.

BRIEF DESCRIPTION OF THE DRAWINGS

The present invention is illustrated by way of example and not limitation in the accompanying figures.

DETAILED DESCRIPTION OF THE INVENTION

Figure 1:
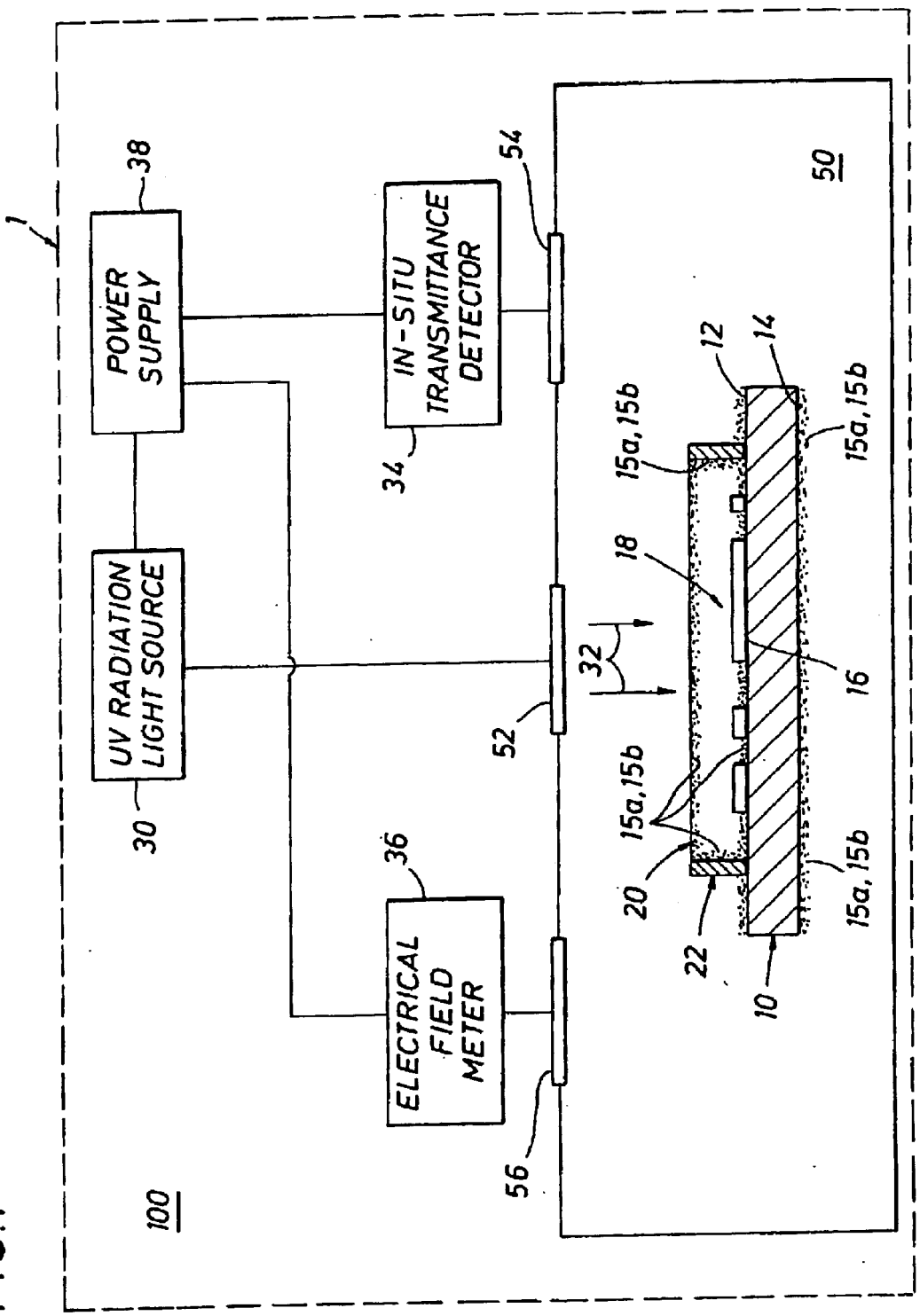
FIG. 1 schematically illustrates an embodiment of an apparatus according to this invention to remove organic matter and particulate contamination present on a reticle and a pellicle and to control electrostatic discharge (ESD) through in-situ application of ultraviolet light (UV) radiation during semiconductor manufacture.

An apparatus and method to remove organic matter and particulate contamination present on surfaces of a reticle and a pellicle and to control electrostatic discharge (ESD) through in-situ application of ultraviolet light radiation during semiconductor manufacture are described.

The terms "photomask", "mask," and "reticle" are used interchangeably and will be used interchangeably hereinafter. The terms "organic matter contamination," "molecular contamination," and "surface organic contamination" are used interchangeably and will be used interchangeably hereinafter. Surface organic contamination typically includes, but is not limited to, chemical stains, residues, fatty acids, plasticizers, etc. from the reticle/mask fabrication process and reticle handling/storage.

In the following detailed description, numerous specific details are set forth in order to provide a more thorough understanding of the present invention. However, it will be apparent to those skilled in the art to which this invention pertains that the present invention may be practiced without these specific details. In other instances, well-known devices, methods, procedures, and individual components have not been described in detail so as not to unnecessarily obscure aspects of the present invention.

Semiconductor device processes employ photolithography for transferring circuit patterns onto a semiconductor substrate, such as a wafer. In general, photolithography involves the performance of a sequence of process steps, including coating a semiconductor wafer with a resist layer, exposing the coated wafer to a patterned light source, developing the resist layer, processing the semiconductor wafer through the developed resist layer, and removing the resist layer. An optical photolithography stepper apparatus, sometimes referred to as a "stepper," is typically used to expose the resist layer. An image of each layer of an integrated circuit die is formed on a small rectangle piece of glass referred to as a mask or reticle. The reticle is placed on the stepper and a reduced image thereof is projected onto a portion of the resist layer covering the semiconductor wafer.

Since reticles or masks serve the same function as negatives in photography, reticles must be verified and proved as being defect-free before they are used in the stepper tool. Any defects present in the reticle and/or pellicle become defects in the silicon wafer and could lead to defective semiconductor devices. The present invention employs ultraviolet (UV) radiation to simultaneously remove reticle and pellicle organic contamination and particulate contamination and to control electrostatic discharge during semiconductor manufacture (including lithography) and/or mask fabrication process. Removing reticle molecular or organic contamination allows for precision material property measurement, and specifically for improved transmittance measurement of the reticle, ultimately leading to improved semiconductor/integrated circuit manufacture.

FIG. 1 schematically illustrates an exemplary embodiment of an apparatus to simultaneously remove organic matter and particulate contamination from a reticle and/or a pellicle and to control electrostatic discharge (ESD) through in-situ application of ultraviolet light radiation. With reference to FIG. 1, apparatus 1 includes chamber 50 where reticle substrate 10 and pellicle 20 having a frame 22 affixed thereon are placed on a holder during the UV irradiation process (for clarity, holder is not shown in FIG. 1).

Reticle 10 is a transparent ceramic substrate having first and second planar surfaces 12, 14. A circuit pattern 16, called absorber, is disposed on the first planar surface 12 of reticle 10. Circuit pattern 16 is generally composed of opaque materials such as chromium that prevents ultraviolet light from transmitting therethrough. Reticle 10 can be constructed of any suitable transparent ceramic materials, including for example quartz or silicon dioxide. For advanced lithography applications, such as 157-nm and Extreme Ultraviolet (EUV) lithography, other materials, for example modified fused silica, are expected to meet the reticle substrate material requirements. The chrome metal layer may be formed using either pure chromium or a chromium alloy. Metallic coatings other than chrome may also be coated on the surface of the reticle for the circuit layout.

Pellicle 20 is generally used to seal the reticle 10, isolating and protecting at least the first planar surface 12 of reticle 10 from particulate contamination and eliminating dust or other particles from the focal plane of the reticle pattern during the manufacture of integrated circuits. Pellicle 20 is typically mounted onto a frame 22 which is then mounted to the reticle 10, typically surrounding a reticle area having the circuit pattern 16 therewith. When coupled together, reticle 10, pellicle 20 and frame 22 define (and enclose) a volume of space 18. The shapes of the frame 22 and the pellicle 20 attached to the frame vary considerably depending upon the configuration of the reticle, the type of photolithography application being performed, the constraints of the photolithography equipment and the like.

During UV irradiation of the reticle 10, pellicle 20 and frame 22, chamber 50 is generally purged with an inert gas, such as nitrogen, which maintains the chamber environment moisture-free. Chamber 50 may include one or more windows or openings 52, 54, 56 where the UV light radiation source and various detectors are generally coupled to the chamber.

Continuing with reference to FIG. 1, apparatus 1 further includes a UV light radiation source 30 that is coupled to chamber 50 at the UV light window 52. During the UV irradiation process, the reticle and/or pellicle are irradiated by a UV light radiation beam 32 emitted by the UV light radiation source 30. A power supply 38 electrically coupled to the UV light radiation source 30 provides electrical power required to operate the UV light radiation source 30. The UV light radiation source 30 may include any UV light radiation producing sources used in the art, including but not limited to excimer lamps, laser sources and the like. Generally, to remove organic matter contamination 15a and particulate contamination 15b present on a reticle 10 and/or a pellicle 20 and to control ESD through in-situ application of ultraviolet light radiation, the reticle and/or pellicle are irradiated using an ultraviolet light radiation beam 32 having a wavelength of less than 206 nanometers but more than about 1 nanometer. In one embodiment, for 157-nm lithography applications, the ultraviolet light radiation beam 32 has a wavelength in the range of 157–206 nanometers. For Extreme UV lithography applications, the ultraviolet light radiation beam 32 may have a wavelength in the range of 10–157 nanometers. In an embodiment, the UV light radiation source 30 is a Xenon excimer lamp producing a ultraviolet light radiation beam 32 having a wavelength of about 172 nanometers.

Continuing with reference to FIG. 1, apparatus 1 further includes a transmittance detector 34 coupled to chamber 50 at transmittance detector window 54. Power supply 38 is electrically coupled to transmittance detector 34 and provides electrical power required to operate the transmittance detector 34. The transmittance detector 34 may be used to perform in-situ transmittance measurements and monitoring of the reticle 10 during reticle fabrication and handling, as well as prior to shipping the reticle to a customer. Any transmittance detector known in the art of semiconductor processing, including mask/lithography applications, may be used.

To perform in-situ electrostatic discharge measurements of the reticle and/or pellicle, apparatus 1 may further include an electric field meter 36. In an embodiment, the electric field meter 36 is coupled to the processing chamber 50 at electric field meter window 56. Power supply 38 is electrically coupled to electric field meter 36 and provides electrical power required to operate electric field meter 36. Any electric field meter known in the art of semiconductor processing, including mask/lithography applications, may be used.

It should be noted that apparatus 1 to simultaneously remove organic matter and particulate contamination 15a, 15b from a reticle and/or a pellicle and to control ESD through in-situ application of ultraviolet light radiation may be part of any semiconductor processing tool assembly 100 known in the art, including but not limited to a lithography processing tool assembly, pre-lithography processing tool assembly, semiconductor wafer manufacture tool assembly and combination thereof.

Figure 2:
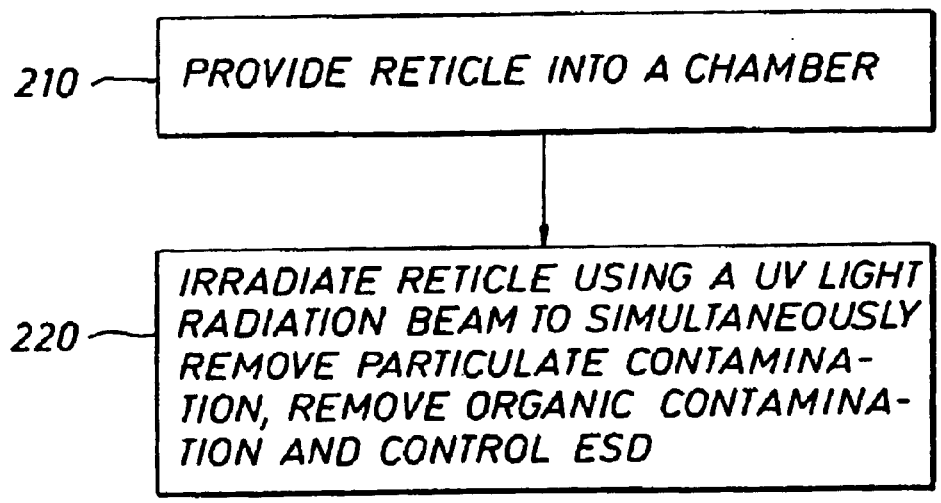
FIG. 2 is an embodiment of a process according to this invention to remove organic matter and particulate contamination present on surfaces of a reticle and to control ESD through in-situ application of UV radiation.

Referring now to FIG. 2, an embodiment of a process to simultaneously remove organic matter and particulate contamination present on a reticle and control ESD and is illustrated. With reference to FIGS. 1 and 2, as part of block 210, a reticle 10 having first and second planar surfaces 12, 14 is provided in a chamber 50. A circuit pattern 16 may be disposed on the first planar surface 12 of reticle 10. Next (block 220 in FIG. 2), reticle 10 is irradiated using an ultraviolet light radiation beam 32 that simultaneously removes contamination 15a, 15b disposed on the first and second planar surfaces 12, 14 of the reticle 10 and neutralizes static electricity accumulated by the reticle 10. To remove organic matter and particulate contamination 15a, 15b present on a reticle 10 and to control ESD, the reticle is irradiated using an ultraviolet light radiation beam 32 having a wavelength of less than 206 nanometers but more than 1 nanometer. In one embodiment, for 157-nm lithography applications, the ultraviolet light radiation beam 32 has a wavelength in the range of 157–206 nanometers. For Extreme UV lithography applications, the ultraviolet light radiation beam 32 may have a wavelength in the range of 10–157 nanometers. During UV irradiation of the reticle 10, chamber 50 is generally purged with an inert gas, such as nitrogen, which maintains the chamber environment moisture-free.

The ultraviolet light radiation beam 32 is produced (i.e., emitted) by a UV light radiation source 30. A power supply 38 electrically coupled to the UV light radiation source 30 provides electrical power required to operate the UV light radiation source 30. The UV light radiation source 30 may include any UV light radiation producing sources used in the art, including but not limited to excimer lamps, laser sources and the like. In an embodiment, the UV light radiation source 30 is a Xenon excimer lamp producing a ultraviolet light radiation beam 32 having a wavelength of about 172 nanometers. Various detectors, such as a transmittance detector, an electric field meter and the like, are generally coupled to chamber 50 to provide in-situ transmittance measurement and monitoring and/or electrical field measurement of the reticle.

It should be noted that chamber 50 is typically part of a processing tool assembly 100, which may include, but is not limited to, a lithography processing tool assembly, a pre-lithography processing tool assembly, a semiconductor wafer manufacture tool assembly, or a combination thereof.

Figure 3:
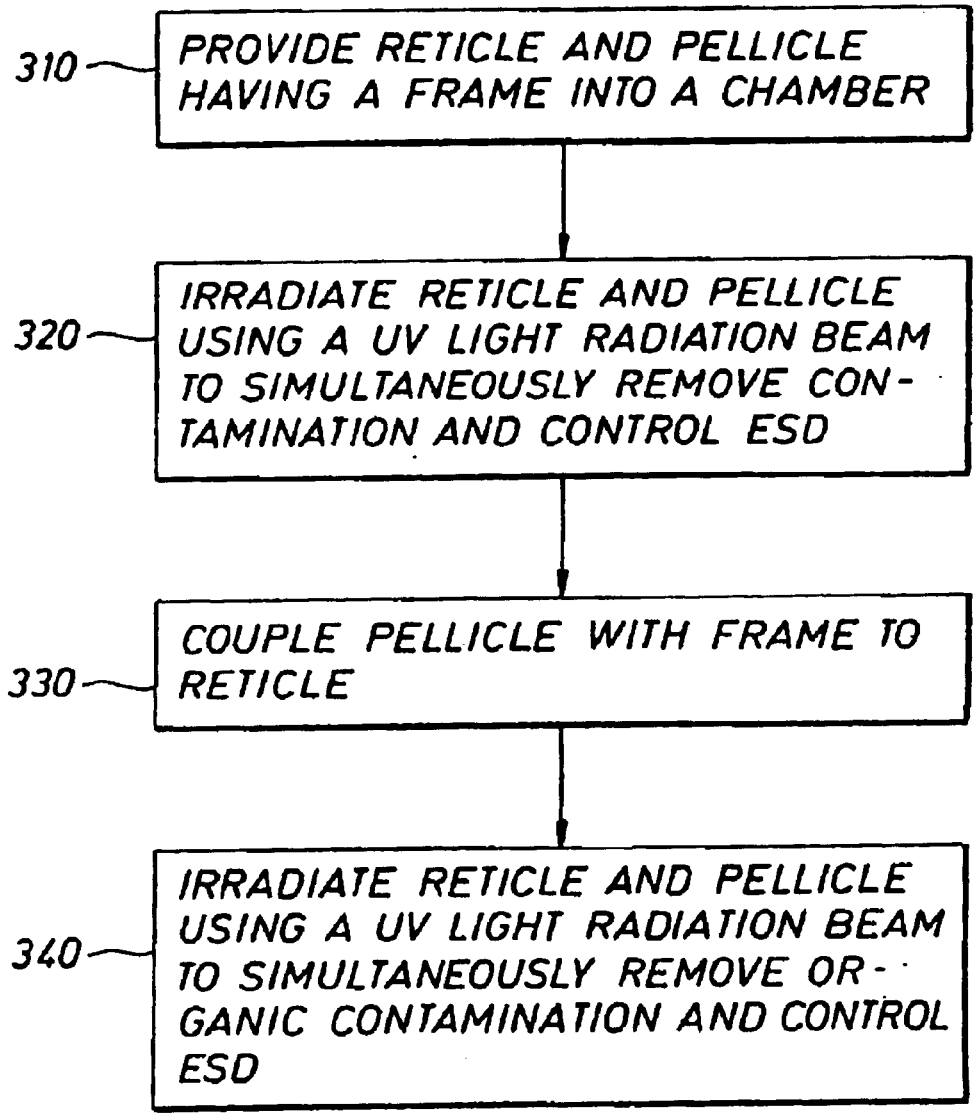
FIG. 3 is another embodiment of a process according to this invention to remove organic matter and particulate contamination present on a reticle, a pellicle and within the volume of space between the reticle and the pellicle, and to control ESD.

Referring now to FIG. 3, another embodiment of a process to simultaneously remove organic matter and particulate contamination present on a reticle and pellicle and control ESD and is illustrated. With reference to FIGS. 1 and 3, a reticle substrate 10 and a pellicle 20 having a frame 22 affixed thereon are provided into a chamber 50 (block 310 in FIG. 3). Reticle 10 generally has first and second planar surfaces 12, 14. A circuit pattern 16 may be disposed on the first planar surface 12 of reticle 10.

At block 320, prior to coupling the reticle to the pellicle, the reticle 10 and the pellicle 20 (with its frame 22) are irradiated using an ultraviolet light radiation beam 32 to remove contamination 15a, 15b disposed on the reticle and the pellicle, and to neutralize static electricity accumulated by the reticle and the pellicle. During UV irradiation of the reticle 10, chamber 50 is generally purged with an inert gas, such as nitrogen, which maintains the chamber environment moisture-free. The ultraviolet light radiation beam 32 may have a wavelength of less than 206 nanometers but more than 1 nanometer. In one embodiment, for 157-nm lithography applications, the ultraviolet light radiation beam 32 has a wavelength in the range of 157–206 nanometers. For Extreme UV lithography applications, the ultraviolet light radiation beam 32 may have a wavelength in the range of 10–157 nanometers.

The ultraviolet light radiation beam 32 is produced (i.e., emitted) by a UV light radiation source 30. A power supply 38 electrically coupled to the UV light radiation source 30 provides electrical power required to operate the UV light radiation source 30. The UV light radiation source 30 may include any UV light radiation producing sources used in the art, including but not limited to excimer lamps, laser sources and the like. In an embodiment, the UV light radiation source 30 is a Xenon excimer lamp producing a ultraviolet light radiation beam 32 having a wavelength of about 172 nanometers.

Next, at block 330, the pellicle is coupled to the first planar surface 12 of the reticle 10 such that the frame 22 of the pellicle encloses an area of the reticle 10 having the circuit pattern 16 thereon. Adhesives or the like may be used to couple the pellicle to the reticle.

At block 340, the pellicle coupled to the reticle are further irradiated using a ultraviolet light radiation beam 32 produced by the UV source 30. This irradiation typically removes molecular contamination 15a present on the pellicle and the reticle. Most importantly, however, this irradiation removes molecular contamination 15a that may be present within the volume of space (item 18 in FIG. 1) defined by the reticle 10, the pellicle 20 and the frame 22.

It should be noted that chamber 50 is typically part of a processing tool assembly 100, which may include, but is not limited to, a lithography processing tool assembly, a pre-lithography processing tool assembly, a semiconductor wafer manufacture tool assembly, or a combination thereof.

Figure 4:
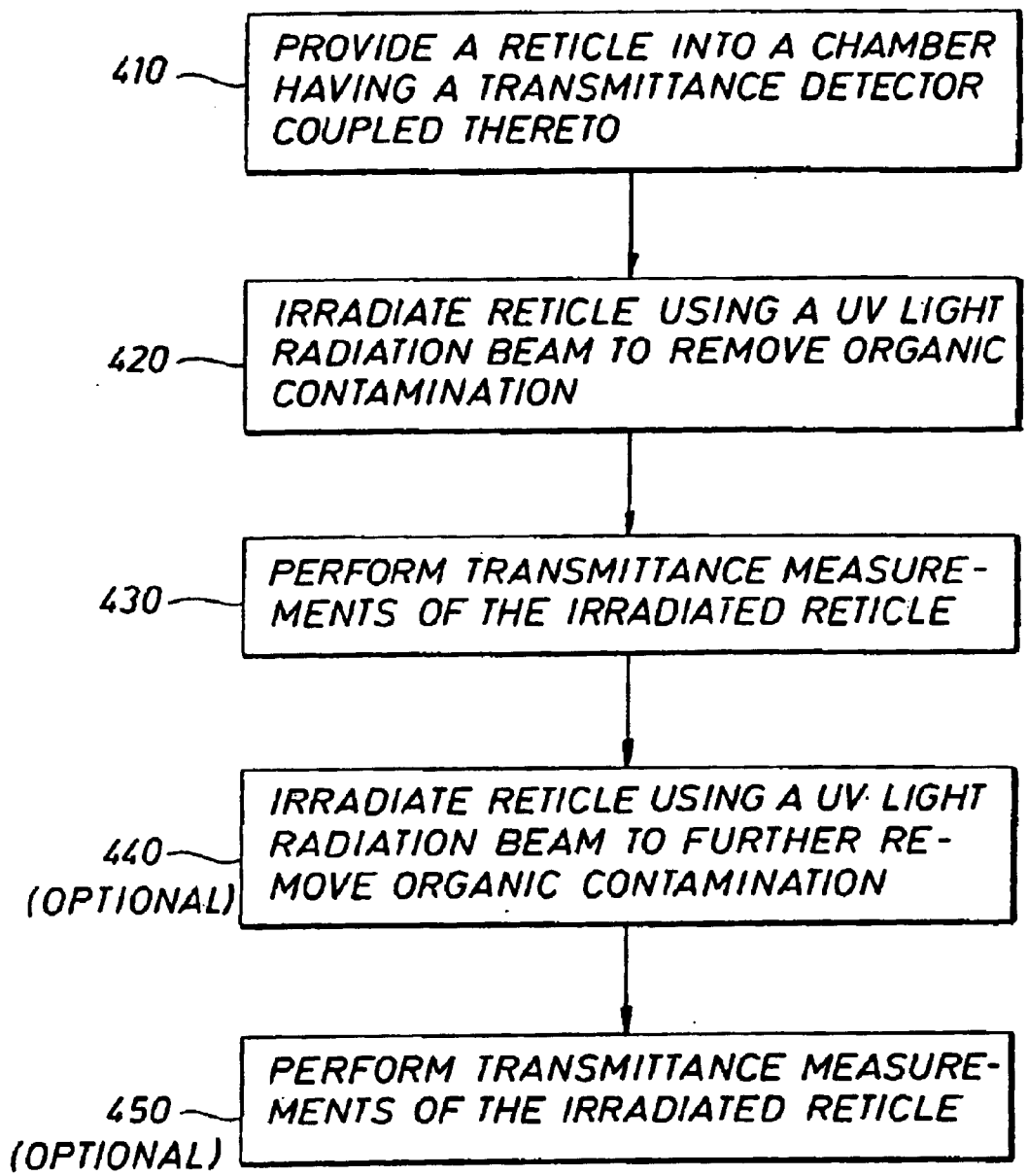
FIG. 4 is an embodiment of a process according to this invention to improve the transmittance and reflectance measurements of a reticle through the use of in-situ UV radiation.

Referring now to FIG. 4, an embodiment of a process to perform in-situ organic contamination clean and transmittance measurements of a reticle according to this invention is illustrated. With reference to FIGS. 1 and 4, a reticle 20 is provided into a chamber 50 (block 410 in FIG. 4). Chamber 50 is typically part of a processing tool assembly 100, which may include, but is not limited to, a lithography processing tool assembly, a pre-lithography processing tool assembly, a semiconductor wafer manufacture tool assembly, or a combination thereof.

To perform in-situ transmittance measurements and monitoring of the reticle 10, a transmittance detector 34 is coupled to chamber 50 at a transmittance detector window 54. Power supply 38 is electrically coupled to transmittance detector 34 and provides electrical power required to operate the transmittance detector 34. The transmittance detector 34 may be used during reticle fabrication and handling, as well as prior to shipping the reticle to a customer. Any transmittance detector known in the art of semiconductor processing, including mask/lithography applications, may be used.

At block 420, the reticle is irradiated using an ultraviolet light radiation beam (item 32 in FIG. 1) to remove organic contamination 15a disposed on the reticle. During UV irradiation of the reticle 10, chamber 50 is generally purged with an inert gas, such as nitrogen, which maintains the chamber environment moisture-free. The ultraviolet light radiation beam 32 may have a wavelength of less than 206 nanometers but more than 1 nanometer. In one embodiment, for 157-nm lithography applications, the ultraviolet light radiation beam 32 has a wavelength in the range of 157–206 nanometers. For Extreme UV lithography applications, the ultraviolet light radiation beam 32 may have a wavelength in the range of 10–157 nanometers.

The ultraviolet light radiation beam 32 is produced (i.e., emitted) by a UV light radiation source 30. A power supply 38 electrically coupled to the UV light radiation source 30 provides electrical power required to operate the UV light radiation source 30. The UV light radiation source 30 may include any UV light radiation producing sources used in the art, including but not limited to excimer lamps, laser sources and the like. In an embodiment, the UV light radiation source 30 is a Xenon excimer lamp producing a ultraviolet light radiation beam 32 having a wavelength of about 172 nanometers.

Continuing with reference to FIGS. 1 and 4, next (block 430 in FIG. 4) at least one in-situ transmittance measurement of the irradiated reticle is performed using the transmittance detector 34 coupled to the chamber 50 and an electrical power supply 38. Depending on the transmittance measurement results obtained in block 430, the reticle may be further irradiated using the ultraviolet light radiation beam (item 32 in FIG. 1) to remove any organic contamination 15a present on the reticle (block 440 in FIG. 4).

Following the follow up irradiation of the reticle, additional in-situ transmittance measurements of the irradiated reticle 10 may be performed using the transmittance detector 34 coupled to the chamber 50 and an electrical power supply 38 (block 450 in FIG. 4).

It should be noted that prior to performing the initial or first UV irradiation of the reticle (block 420 in FIG. 4) a reference transmittance measurement of the reticle may be carried out. Comparing the at least one in-situ transmittance measurement of the irradiated reticle with the in-situ reference transmittance measurement removes the uncertainly associated with organic contamination-induced transmittance loss, ultimately leading to better mask and semiconductor device manufacture.

An apparatus and method to remove organic matter and particulate contamination present on a reticle and a pellicle and to control electrostatic discharge (ESD) through in-situ application of ultraviolet light radiation during semiconductor manufacture have been described. Although specific embodiments, including specific parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

We claim:

1. A method to remove contamination and control electrostatic discharge in a semiconductor manufacture process, the method comprising:

providing a reticle having first and second planar surfaces into a chamber;

irradiating the reticle using an ultraviolet light radiation beam to remove contamination disposed on the reticle and to neutralize static electricity accumulated by the reticle.

2. The method of claim 1 wherein contamination is selected from the group consisting of particulate contamination, molecular contamination and dust contamination.

3. The method of claim 1 further comprises providing a pellicle having a frame affixed thereon into the chamber.

4. The method of claim 3 further comprises irradiating the pellicle using the ultraviolet light radiation beam to remove contamination disposed on the pellicle and to neutralize static electricity accumulated by the pellicle.

5. The method of claim 4 wherein contamination is selected from the group consisting of particulate contamination, molecular contamination and dust contamination.

6. The method of claim 4 further comprises coupling the pellicle to the first planar surface of the reticle such that the frame of the pellicle encloses an area of the reticle having a circuit pattern of opaque material thereon.

7. The method of claim 6 further comprises irradiating the reticle coupled to the pellicle using the ultraviolet light radiation beam to remove molecular contamination present on the reticle, the pellicle and a volume of space defined by the reticle, the pellicle and the fram.

8. The method of claim 1 where the ultraviolet light radiation beam has a wavelength in a range of approximately 1–206 nanometers.

9. The method of claim 1 wherein the ultraviolet light radiation beam is produced by an ultraviolet light producing source comprising a Xenon excimer lamp or a laser source electrically coupled to an electrical power supply.

10. The method of claim 1 wherein the ultraviolet light radiation beam is produced by a Xenon excimer lamp having a wavelength of about 172 nanometers.

11. The method of claim 1 wherein the chamber is purged with an inert gas comprising nitrogen at least during irradiating the reticle.

12. The method of claim 1 wherein the chamber is part of a processing tool assembly.

13. The method of claim 12 wherein the processing tool assembly is selected from the group consisting of lithography processing tool assembly, pre-lithography processing tool assembly, semiconductor wafer manufacture tool assembly and combination thereof.

14. A method to remove contamination and to control electrostatic discharge in a semiconductor manufacture process, the method comprising:

providing a reticle having first and second planar surfaces into a chamber, the reticle further having a circuit pattern of opaque material on the first planar surface;

providing a pellicle into the chamber, the pellicle having a frame affixed thereon;

irradiating the reticle and the pellicle using an ultraviolet light radiation beam to simultaneously remove contamination disposed on the reticle and the pellicle, and to neutralize static electricity accumulated by the reticle and the pellicle.

15. The method of claim 14 wherein contamination is selected from the group consisting of particulate contamination, molecular contamination and dust contamination.

16. The method of claim 14 further comprises coupling the pellicle to the first planar surface of the reticle such that the frame of the pellicle encloses an area of the reticle having the circuit pattern thereon.

17. The method of claim 16 further comprises irradiating the pellicle coupled to the reticle using the ultraviolet light radiation beam to remove molecular contamination present on the pellicle, the reticle, and a volume of space defined by the reticle, the pellicle and the frame.

18. The method of claim 14 wherein the ultraviolet light radiation beam is produced by an Xenon excimer lamp having a wavelength of about 172 nanometers, the Xenon excimer lamp electrically coupled to a power supply.

19. An apparatus to remove contamination and control electrostatic discharge in-situ in a semiconductor manufacture process, the apparatus comprising:

a chamber to process at least a reticle therein;

an ultraviolet light radiation source coupled to the chamber; and an electrical power supply coupled to the ultraviolet light radiation source.

20. The apparatus of claim 19 further comprises a transmittance detector coupled to the chamber and the electrical power supply, the transmittance detector to perform in-situ transmittance measurements and monitoring of the reticle.

21. The apparatus of claim 19 further comprises an electric field meter coupled to the chamber and the electrical power supply, the electric field meter to perform in-situ electrostatic discharge measurements of the reticle.

22. The apparatus of claim 19 wherein the chamber also processes a pellicle having a frame affixed thereon.

23. The apparatus of claim 19 wherein the ultraviolet light radiation source comprises a Xenon excimer lamp, a laser source, or a combination thereof.

24. The apparatus of claim 19 wherein the ultraviolet light radiation source to produce an ultraviolet light radiation beam having a wavelength in a range of approximately 1–206 nanometers.

25. The apparatus of claim 19 wherein the chamber is purged with an inert gas comprising nitrogen.

26. The apparatus of claim 19 wherein the chamber is part of a processing tool assembly selected from a processing tool assembly group consisting of lithography processing tool assembly, pre-lithography processing tool assembly, semiconductor wafer manufacture tool assembly and combination thereof.

27. A method to perform in-situ organic contamination clean and transmittance measurements of a reticle, the method comprising:

provilding a reticle into a chamber;

irradiating the reticle using an ultraviolet light radiation beam to remove organic contamination disposed on the reticle; and performing at least one in-situ transmittance measurement of the irradiated reticle using a transmittance detector coupled to the chamber and an electrical power supply.

28. The method of claim 27 further comprises performing a reference transmittance measurement of the reticle prior to irradiating the reticle and comparing the at least one in-situ transmittance measurement of the irradiated reticle with the reference transmittance measurement.

29. The method of claim 27 wherein the ultraviolet light radiation beam is produced by an excimer lamp having a wavelength in a range of approximately 1–206 nanometers, the excimer lamp electrically coupled to the power supply.

* * * * *